(12) United States Patent
Belledent

(10) Patent No.: US 9,542,505 B2
(45) Date of Patent: Jan. 10, 2017

(54) METHOD AND SYSTEM FOR PREPARING A PATTERN TO BE PRINTED ON A PLATE OR MASK BY ELECTRON BEAM LITHOGRAPHY

(71) Applicants: COMMISSARIAT A L'ENERGIE ATOMIQUE ET AUX ENE ALT, Paris (FR); ASELTA NANOGRAPHICS, Grenoble (FR)

(72) Inventor: Jerome Belledent, Meylan (FR)

(73) Assignees: Commissariat à l'énergie atomique et aux énergies alternatives, Paris (FR); ASELTA NANOGRAPHICS, Grenoble (FR)

( * ) Notice: Subject to any disclaimer, the term of this patent is extended or adjusted under 35 U.S.C. 154(b) by 467 days.

(21) Appl. No.: 13/967,740

(22) Filed: Aug. 15, 2013

(65) Prior Publication Data

US 2014/0059503 A1    Feb. 27, 2014

(30) Foreign Application Priority Data

Aug. 24, 2012 (FR) .................................. 12 57975

(51) Int. Cl.
*G06F 17/50* (2006.01)
*G03F 7/20* (2006.01)
(Continued)

(52) U.S. Cl.
CPC ............... *G06F 17/50* (2013.01); *B82Y 10/00* (2013.01); *B82Y 40/00* (2013.01); *G03F 7/2063* (2013.01);
(Continued)

(58) Field of Classification Search
USPC ......................................................... 716/54
See application file for complete search history.

(56) References Cited

U.S. PATENT DOCUMENTS

| 6,556,702 | B1 | 4/2003 | Rishton et al. |
| 8,563,224 | B1 * | 10/2013 | Chen .................. G03F 1/20 345/443 |
| 2012/0286173 | A1 | 11/2012 | Van De Peut et al. |

FOREIGN PATENT DOCUMENTS

WO    WO 2010/134018 A2    11/2010

OTHER PUBLICATIONS

Luc Martin, et al., "Combined dose and geometry correction (DMG) for low energy multi electron beam lithography (5kV): application to the 16nm node", Proceedings of SPIE, vol. 8323, XP055061227, Mar. 1, 2012, 10 pages.

(Continued)

*Primary Examiner* — Eric Lee
(74) *Attorney, Agent, or Firm* — Oblon, McClelland, Maier & Neustadt, L.L.P.

(57) ABSTRACT

A method for preparing a pattern to be printed on a plate or mask by electron beam lithography comprising the following steps: modelling of the pattern by breaking down this pattern into a set of elementary geometric shapes intended to be printed individually in order to reproduce said pattern and, for each elementary geometric shape of the model; determination of an electrical charge dose to be applied to the electron beam during the individual printing of the elementary shape, this dose being chosen from a discrete set of doses including several non-zero predetermined doses recorded in memory. The set of elementary geometric shapes is a bidimensional paving of identical elementary geometric shapes covering the pattern to be printed. In addition, when the doses to be applied to the elementary geometric shapes are determined, a discretization error correction is made by dithering.

10 Claims, 3 Drawing Sheets

(51) Int. Cl.
*H01J 37/317* (2006.01)
*B82Y 10/00* (2011.01)
*B82Y 40/00* (2011.01)
*G03F 1/70* (2012.01)

(52) U.S. Cl.
CPC ............ *H01J 37/3174* (2013.01); *G03F 1/70* (2013.01); *H01J 2237/31764* (2013.01)

(56) References Cited

OTHER PUBLICATIONS

"Multi-tone rasterization, dual pass scan, data path and cell based vector format", ip.com Journal, PriorArtDatabase, XP013131917, May 22, 2009, 108 pages.
Christophe Pierrat, et al., "Mask Data Correction Methodology in the Context of Model-Based Fracturing and Advanced Mask Models", Proceedings of SPIE, vol. 7973, XP055061198, Mar. 17, 2011, 11 pages.
French Preliminary Search Report and Written Opinion issued May 13, 2013, in French 1257975, filed Aug. 24, 2012 (with English Translation of Categories of Cited Documents).

* cited by examiner

METHOD AND SYSTEM FOR PREPARING A PATTERN TO BE PRINTED ON A PLATE OR MASK BY ELECTRON BEAM LITHOGRAPHY

The invention relates to a method for preparing a pattern to be printed on a plate or mask by electron beam lithography. It also relates to a system for designing a printed circuit using this method and a corresponding computer program.

BACKGROUND OF THE INVENTION

It applies to the field of lithography with a tunable variable shaped electron beam, according to which an electron beam transmitted by a machine has a shape which can be tuned thanks to mobile try squares. The tunable shape is usually rectangular and the lateral dimensions of this rectangular shape are tunable thanks to the try squares.

The invention applies more particularly to a method of this type comprising the following steps:
- modelling of the pattern by breaking down this pattern into a set of elementary geometric shapes intended to be printed individually by tuning the shape of the electron beam in order to reproduce said pattern, and recording of the model obtained in memory, and
- for each elementary geometric shape of the model, determination, by a processor having access to the memory, of a dose of electrical charges to be applied to the electron beam during the individual printing of this elementary geometric shape, this dose being chosen from a discrete set of predetermined doses recorded in memory.

Electron beam lithography cannot dispense with a phase of preparing the pattern to be printed because of the proximity effects caused by the diffusion of the electrons, chemical species in the resin, or other effects liable to deform the pattern to be printed, and that it is necessary to compensate. In general terms, a well known method consists of modelling the pattern by a set of simple elementary geometric shapes, for example rectangles, which can each be printed individually by exposure to the variable shaped electron beam for a certain length of time (referred to as the exposure time). The set of geometric shapes does not precisely correspond to the contours of the pattern but, by judiciously parameterising the exposure time and by allocating for each a dose, previously calculated, of electrical charges to be applied to the electron beam for printing thereof, the pattern can be printed with satisfactory precision and having compensated for the aforementioned effects.

DESCRIPTION OF THE PRIOR ART

A first solution consists more precisely of modelling the pattern by a set of juxtaposed elementary shapes and allocating to each elementary shape a dose and an exposure time that are independent of the others. Also knowing that in practice the doses must be chosen from a discrete limited set of predetermined doses, it is then often necessary to increase the number of elementary geometric shapes and to provide certain shapes of small sizes in order to compensate for the discretisation of the doses and to obtain good printing precision. However, the reliability of current equipment does not make it possible to expose small shapes, in particular shapes with dimensions of less than 10 nm. Furthermore, the more the number of geometric shapes to be exposed individually and successively is increased, the more the overall exposure time, which represents the sum of individual exposure times for the elementary geometric shapes of the model, is increased.

Another solution is for example described in the article by C. Pierrat et al, entitled "Mask data correction methodology in the context of model-base fracturing and advanced mask models" published in Proceedings SPIE of Optical Microlithography n° 24, vol. 7973, 1-3 Mar. 2011, San Jose (Calif.), US. This solution allows the superimposition of elementary geometric shapes so that it is thus possible to very substantially reduce their number and limit the geometric shapes of small sizes. However, the superimposition of shapes makes the other parameters, in particular the electrical charge doses and the exposure times, dependent on each other. This reduces accordingly the degrees of freedom and does not necessarily make it possible to print certain complex geometric shapes. Furthermore, this makes the determination of doses appreciably more complex, in particular since local overintensities in the intersections of shapes cannot be avoided.

International patent application WO 2010/134018 A2, paper by Martin et al entitled "Combined dose and geometry correction (DMG) for low energy multi electron beam lithography (5 kV): application to the 16 nm mode" published in Proceedings of SPIE vol. 8323 pages 83231W-1 à 83231W-10, and paper in IP.COM Journal entitled "Multitone rasterization, dual pass scan, data path, cell based vector format", all disclose pixelizing a pattern and successively printing the pixels by scan using binary doses applied to multiple scanned beamlets. But these disclosures do not relate to the field of variable shaped electron beam lithography. They relate to the field of rasterscan lithography with multiple untunable Gaussian beamlets, according to which electron beams are smaller, called beamlets, but not shaped. In this field, dosing a zone to be printed can be modulated only by pixelizing the zone and then binarizing by dithering. The size of pixels is usually around 1 nm, i.e. much less than 10 nm. The smaller the size of the pixels, the better the accuracy of dithering since each pixel is assigned a binary value of dose. On the contrary, in the field of the invention, i.e. variable shaped electron beam lithography, it is desirable that the elementary geometric shapes modelling a pattern are as large as possible, especially more than 10 nm or even 20 nm, to reduce the overall time exposure and to take into account that it is not possible to expose small shapes inferior to 10 nm.

It may thus be desired to provide a method for preparing a pattern to be printed on a plate or mask by variable shaped electron beam lithography that makes it possible to dispense with at least some of the aforementioned problems and constraints.

SUMMARY OF THE INVENTION

A method for preparing a pattern to be printed on a plate or mask by electron beam lithography is therefore proposed, comprising the following steps:
- modelling of the pattern by breaking down this pattern into a set of elementary geometric shapes intended to be printed individually in order to reproduce said pattern, and recording of the model obtained in memory, and
- for each elementary geometric shape of the model, determination, by a processor having access to the memory, of a dose of electrical charges to be applied to the electron beam during the individual printing of this elementary geometric shape, this dose being chosen from a discrete set of doses including several non-zero predetermined doses recorded in memory, wherein the set of elementary geometric shapes is a bidimensional paving of identical elementary geometric shapes covering the pattern to be printed, and wherein, when the doses to be applied to the geometric shapes are determined, a discretisation error correction is performed by dithering.

By virtue of the invention, the spatial modelling of the pattern by all the elementary geometric shapes is very greatly simplified. These are not only juxtaposed but also identical so as to constitute a paving. Thus, apart from the discretisation of the doses in a discrete set including several non-zero predetermined doses, the modelling is itself simplified, which is judicially compensated for by a discretisation error correction by dithering.

Optionally, a method for preparing a pattern to be printed according to the invention may further comprise a step of grouping adjacent elementary geometric shapes the doses of which are identical, in geometric shapes of greater sizes each intended to be printed in a single exposure to the electron beam. It is thus possible to greatly reduce the number of successive exposures to the electron beam and therefore the total exposure time.

Optionally also, a method for preparing a pattern to be printed according to the invention may further comprise a prior step of modelling the pattern by breaking down this pattern into a theoretical set of geometric shapes with different dimensions associated respectively with a set of theoretical doses, and, when the doses to be applied to the paving of elementary geometric shapes are determined, a prior pixelisation of the theoretical set on the set of elementary geometric shapes is executed in order to determine initial values of doses to be applied to the elementary geometric shapes.

Optionally also, a discrete set of doses is used during the prior modelling step in order to determine the theoretical doses, this discrete set of doses being different from the one used during the determination of the doses to be applied to the elementary geometric shapes, in particular this set comprising fewer discrete dose values.

Optionally also, the determination of the doses to be applied to the elementary geometric shapes comprises the comparison of the initial values of doses with the discrete set of predetermined doses recorded in memory, a selection of doses from this discrete set and said correction by dithering of the errors caused by this selection.

Optionally also, the predetermined doses are defined in the form of a density of electrical charges expressed as a number of charges per unit surface.

Optionally also, the correction by dithering is carried out by means of a predetermined error diffusion matrix, in particular the diffusion matrix of the Floyd-Steinberg algorithm.

Optionally also, when the doses to be applied to the elementary geometric shapes are determined:
  a first discrete set of predetermined doses recorded in memory, referred to as the coarse set, is used for the elementary geometric shapes situated inside the pattern to be printed, and
  a second discrete set of predetermined doses recorded in memory, referred to as the fine set and comprising more discrete values of doses than the coarse set, is used for the elementary geometric shapes situated on the contour of the pattern to be printed.

A computer program downloadable from a communication network and/or recorded on a medium that can be read by computer and/or executed by processor is also proposed, comprising instructions for executing the steps of a method for preparing a pattern to be printed by electron beam lithography as defined previously, when said program is executed on a computer.

A system for designing a printed circuit by printing patterns on a plate or mask by means of electron beam lithography is also proposed, comprising:
  a memory for storing parameters for modelling a pattern by a set of elementary geometric shapes intended to be printed individually in order to reproduce said pattern, and
  a processor programmed for implementing a method for preparing a pattern to be printed as defined previously.

BRIEF DESCRIPTION OF THE DRAWINGS

The invention will be better understood by means of the following description, given solely by way of example and made with reference to the accompanying drawings, wherein.

DESCRIPTION OF THE PREFERRED EMBODIMENTS

Figure 1:
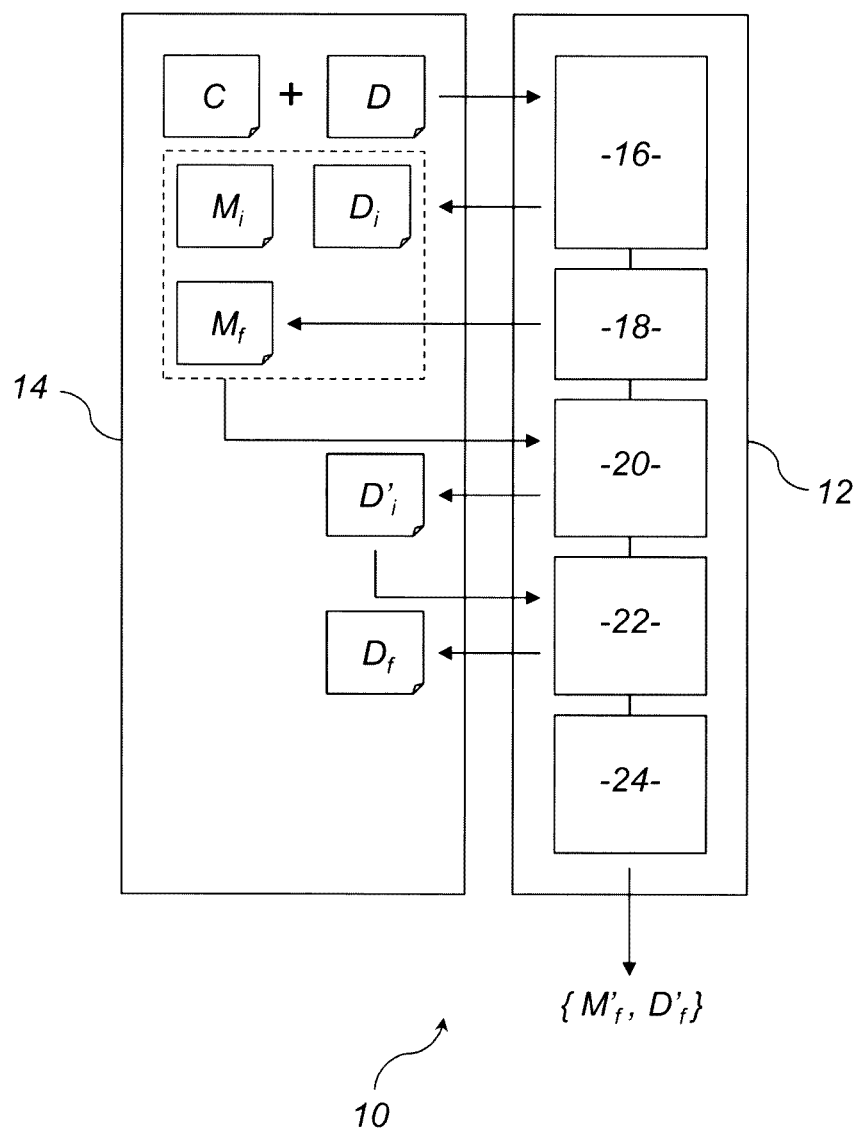
FIG. 1 shows schematically the general structure of a printed circuit design system according to one embodiment of the invention.

The printed circuit design system 10 shown schematically in FIG. 1 comprises a processing module 12 associated in a conventional fashion with a memory 14 (for example a RAM memory). It may for example be used in a data processing device such as a conventional computer comprising a processor associated with one or more memories for storing data files and computer programs. The processing module 12 can then itself be considered to be a form of processor associated with a memory for storing instructions that it executes in the form of computer programs.

The processing module 12 as illustrated in FIG. 1 thus functionally comprises five computer programs 16, 18, 20, 22 and 24.

The first computer program 16 is a program for prior modelling of a given pattern the contour parameters of which are for example stored in memory 14. From the contour C of the pattern to be printed and optionally a table D of discrete dose values including several predetermined non-zero dose values also recorded in memory 14, this first program 16 is designed to provide a theoretical set of geometric shapes $M_t$ of different dimensions modelling the pattern and an associated set of theoretical doses $D_t$ chosen for example from the discrete values of doses in the table D. "Dose" means a quantity of electrical charges to be applied to the electron beam during the individual printing of the geometric shape that is associated therewith. This dose may be defined in the form of an electrical charge density expressed as a number of charges per unit surface, for example in $\mu C/cm^2$. In order to compensate for the fact that the doses must be chosen from the table D of discrete values, the theoretical set $M_t$ comprises a large number of geometric shapes, some of which are of small sizes, able to have dimensions of less than 10 nm. It should be noted that, in a variant and more generally, the theoretical doses $D_t$ chosen during the execution of the computer program 16 may not be discretised, that is to say they may not be limited to the discrete values of doses in the table D.

The second computer program 18 is a program for modelling the given pattern in a set $M_f$ of elementary geometric shapes intended to be printed individually in order to reproduce said pattern. It is designed to constitute this set in the form of a bidimensional paving of identical elementary geometric shapes covering the pattern to be printed, therefore including its contour C. These identical elementary shapes are for example squares with dimensions greater than the aforementioned 10 nm and will subsequently be referred to as "pixels".

The third computer program 20 is a program for pixelisation of the theoretical set $M_i$ on the set of elementary geometric shapes $M_f$. This pixelisation consists, in a manner known per se, of determining, for each pixel in the set of elementary geometric shapes $M_f$, an initial dose value to be applied to it according to the geometric shapes of the theoretical set $M_i$ at least partially covered by this pixel and their associated theoretical doses. This initial value is conventionally determined by linear combination of the portions of the surfaces of the geometric shapes of the theoretical set $M_i$ covered by the pixel in question weighted by the theoretical doses that are associated therewith. The execution of the pixelisation program 20 thus provides a set $D'_i$ of non-discretised initial values of doses to be allocated to each pixel.

The fourth computer program 22 is a program for discretisation and discretisation error correction by dithering. It is designed to discretise the set $D'_i$ of initial values by approaching each of them with one of the discrete values in the table D while correcting the discretisation errors caused by means of any dither algorithm. In general terms, correction by dithering is done by making the discretisation errors random. Advantageously, the dithering may be done by an algorithm that minimises the discretisation errors. Advantageously also, the dithering may be done by diffusion of the discretisation errors by means of a predetermined error diffusion matrix. For this purpose for example the Floyd-Steinberg algorithm is executed, the error diffusion matrix of which on a pixel has the coefficients 7/16 for the pixel situated above, 1/16 for the one situated above to the right, 5/16 for the one situated to the right and 3/16 for the one situated below to the right, running through the pixels from bottom to top and left to right during the discretisation of the initial values of doses and error correction. In this way a set of discretised final doses $D_f$ to be applied to the pixels of the set $M_f$ is supplied.

In order to avoid undesirable effects of deformation of the pattern in the direction of travel chosen, it is possible to make two successive passes during the discretisation and the diffusion of errors: for example from bottom to top and left to right for the first pass during which half of the discretisation errors are corrected on each occasion, and then from top to bottom and right to left for the second pass during which the other half the discretisation errors are corrected on each occasion. In a practical fashion, this can be done by using a discretisation step twice as great in one direction as in the other. In a variant, rather than correcting only half the discretisation errors in each pass, it is possible to use pavings of pixels of different sizes on the occasion of the two passes, or quite simply to offset the paving of the pixels from one pass to the other.

Finally, the fifth computer program 24 is a program for grouping adjacent pixels the discretised final doses of which are identical, in geometric shapes of greater sizes intended to be printed in a single exposure to the electron beam. The result of this grouping can optionally be associated with predetermined complex projection shapes, for example rectangles as a priority. This option is simplified because the model of the pattern adopted for the execution of the second program 18 is itself spatially greatly discretised. The fifth program 24 is therefore designed to provide a set of grouped pixels $M'_f$ optionally in predetermined projection forms, and an associated set of grouped discretised final doses $D'_f$.

It should moreover be noted that the computer programs 16, 18, 20, 22 and 24 are presented as distinct, but this distinction is purely functional. They could just as well be grouped together in one or more software packages. Their functions could also be at least partly microprogrammed or microwired in dedicated integrated circuits. Thus, in a variant, the data processing device implementing the design system 10 could be replaced by an electronic device composed solely of digital circuits (without a computer program) for performing the same actions.

Figure 2:
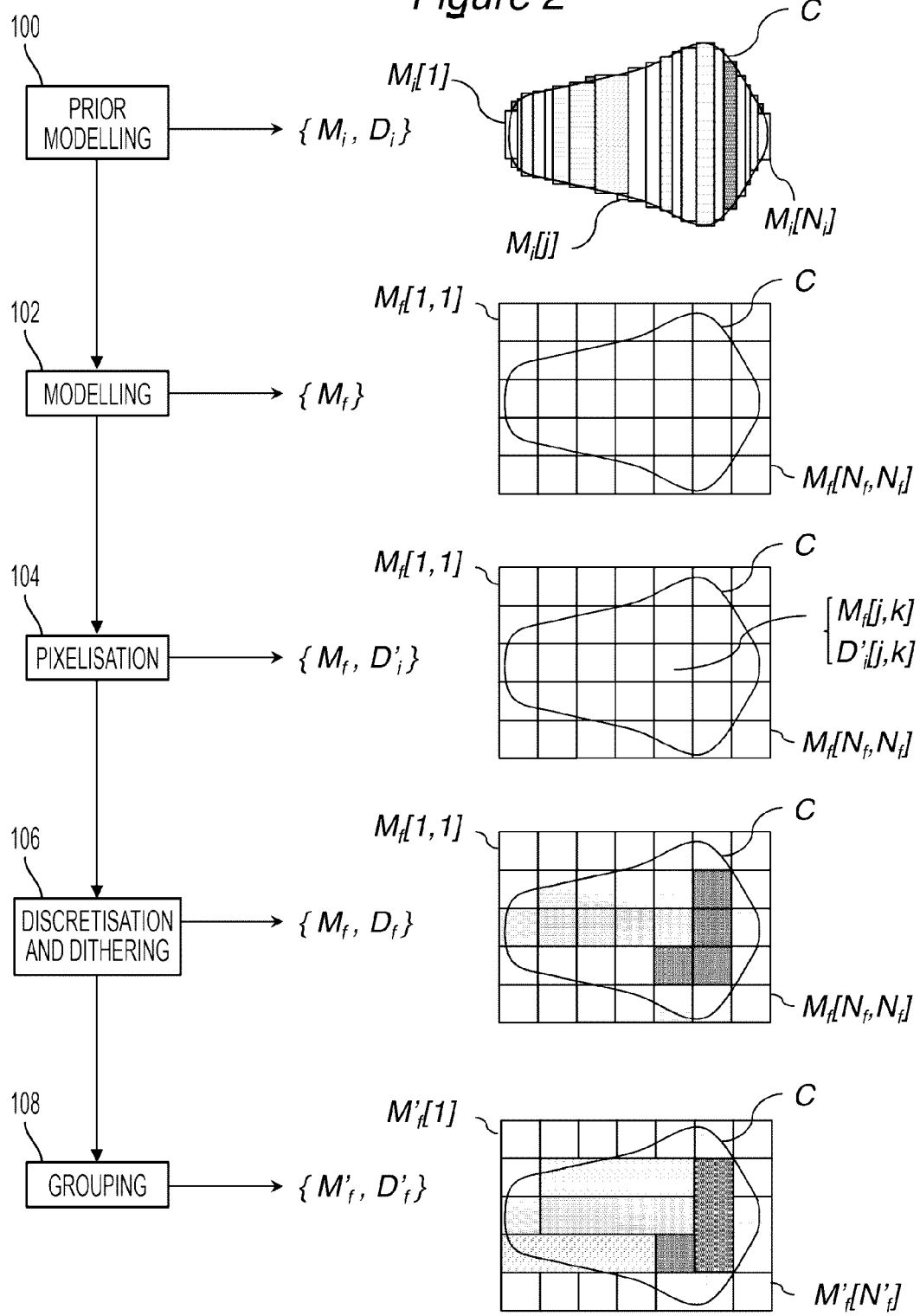
FIG. 2 illustrates the successive steps of a method for preparing a pattern to be printed implemented by the design system of FIG. 1.

The method for preparing a pattern to be printed illustrated in FIG. 2 and implemented by the processing module 12 on execution of the programs 16, 18, 20, 22 and 24 comprises a first step 100, more precisely performed by execution of the first computer program 16, of prior modelling of the pattern to be printed. This prior modelling is performed using the contour C and optionally the table D of discrete values of doses, these data being previously stored in memory 14. It provides the associated theoretical sets $M_i$ and $D_i$, which are in their turn stored in memory 14. It will be noted in FIG. 2 that the rectangular geometric shapes $M_i[1], \ldots, M_i[N]$ adopted for previously modelling the contour of pattern C are numerous and of various sizes. Some, such as the geometric shape bearing the reference $M_i[j]$, are of small size, and may even have dimensions of less than 10 nm, which is not able to allow precise printing of this shape, and therefore finally of the pattern, by lithography, and which extends the constant-dose exposure time of the electron beam.

During a second step 102 of modelling the pattern, performed by execution of the second computer program 18, the set $M_f$ of elementary geometric shapes is generated and stored in memory 14. Each elementary geometric shape $M_f[1,1], \ldots M_f[N_f, N_f]$ in the set takes the form of a pixel.

During a third pixelisation step 104, performed by execution of the third computer program 20 on the basis of the sets $M_i$, $M_f$ and $D_i$, the set $D'_i$ of initial values of doses to be allocated to each pixel is generated and stored in memory 14 in association with the set of elementary geometric shapes $M_f$.

During a fourth discretisation and dithering step 106, performed by execution of the fourth computer program 22 on the basis of the sets $M_f$, $D'_i$, and the table D of discrete dose values, the set $D_f$ of discretised final doses to be allocated to each pixel is generated and stored in memory 14 in association with the set of elementary geometric shapes $M_f$. By way of simple non-limitative illustration, four discretisation levels are shown in FIG. 2 at this step 106.

Finally, during a fifth grouping step 108, performed by execution of the fifth computer program 24 on the basis of the sets $M_f$ and $D_f$, the grouped sets $M'_f$ and $D'_f$ are generated and stored in memory 14. The grouping of pixels greatly reduces the number of successive exposures to the electron beam, which has the direct consequence of reducing the total exposure time very significantly. Thus, in the example illustrated in FIG. 2, the four discretisation levels allow certain groupings of adjacent pixels in rectangles of two, three or four pixels. If the blank pixels are considered to be non-exposed, the grouping of pixels in the example in FIG. 2 makes it possible to pass from twenty two successive exposures at the end of step 106 to only nine successive exposures at the end of step 108.

It should be noted that, in the implementation of the invention, the executions of steps 100 and 108 are optional.

It should also be noted that, in the execution of steps 100 and 106, it is the same table D of discrete values of doses that is used in the above example. However, in different embodiments of the invention, several different tables of discrete values could be used.

In particular and advantageously, the table of discrete values used during step 100 for performing the prior modelling has no particular reason to be the same as the table of discrete values used during the discretisation and dithering step 106. The table of discrete values of doses used before the discretisation and dithering step 106 could be coarser (i.e. with a more limited number of discrete values of doses) than the table used at the prior modelling step 100, so as to optimise the grouping of the pixels at step 108. In addition, in a variant and as emphasised previously during the description of the functioning of the computer program 16 and the performance of step 100, the use of a table of discrete dose values is not essential to step 100, the theoretical doses $D_i$ then being able to be chosen completely freely without discretisation.

Moreover, it will even be possible to use several tables of discrete values during step 106. This is because a coarse table can be used for the pixels situated completely inside the contour C while a finer table with a larger number of discrete values of doses could be used for the pixels situated on the contour, where the pixels contribute more greatly to the correct position of the contour during printing by lithography.

Figure 3:
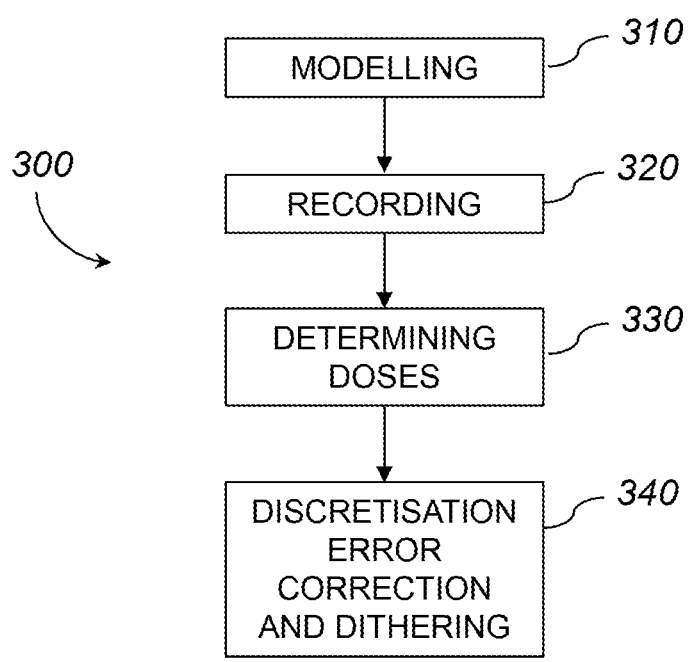
FIG. 3 is a flowchart depicting steps of a method for preparing a pattern to be printed implemented by a printed circuit design system according to an embodiment.

Finally, FIG. 3 is a flowchart depicting steps of a method for preparing a pattern to be printed implemented by a printed circuit design system according to an embodiment. In particular, FIG. 3 shows steps of a method for preparing a pattern for printing on a plate or mask by electron beam lithography 300 consistent with the description provided herein. At step 310, modelling of the pattern is performed by breaking down the pattern into a set of elementary geometric shapes for individual printing to reproduce said pattern. Consistent with step 310, the set of elementary geometric shapes may be a bidimensional paving of identical elementary geometric shapes covering the pattern for printing. The modelled pattern is then recorded as a model in a memory at step 320. At step 330, a dose of electrical charges for application to a variable shaped electron beam during the individual printing of said each elementary geometric shape is determined for each elementary geometric shape of the set in the model by a processor accessing the memory. Consistent with step 330, doses for said each elementary geometric shape of the set in the model may be chosen from among a discrete set of doses including several non-zero predetermined doses recorded in the memory. Finally, at step 340, when the doses for application for said each elementary geometric shape of the set in the model are determined, a discretisation error correction by dithering is performed.

It is clear that a printed circuit design system and a method for preparing a pattern to be printed such as those described above make it possible to model a pattern to be printed on a plate or mask by electron beam lithography using a limited number of spatially discretised elementary geometric shapes, which has the direct consequence of substantially reducing the total time of exposure of the model to the electron beam for reproducing the required pattern on plate or mask. The contribution of the invention is all the more visible in terms of saving in time and gain in precision since the pattern itself has a complex contour, provided that the size of the pixels is optimised compared with the width of the electron beam and the size of the smallest pattern elements to be exposed.

It should also be noted that the invention is not limited to the embodiments described above. It is clear in fact to persons skilled in the art that various modifications can be made to the embodiments described above in the light of the teaching that which has just been disclosed to them. In the following claims, the terms used must not be interpreted as limiting the claims to the embodiments disclosed in the present description but must be interpreted so as to include therein all equivalents that the claims aim to cover because of the wording thereof and the foreseeing of which is within the capability of a person skilled in the art applying his general knowledge to the use of the teaching that has just been disclosed to him.

The invention claimed is:

1. A method for preparing a pattern for printing on a plate or mask by electron beam lithography, comprising:
    modelling of the pattern by breaking down the pattern into a set of elementary geometric shapes for individual printing to reproduce said pattern, and recording the modelled pattern as a model in a memory; and
    determining, for each elementary geometric shape of the set in the model, by a processor accessing the memory, a dose of electrical charges for application to a variable shaped electron beam during the individual printing of said each elementary geometric shape, doses for said each elementary geometric shape of the set in the model being chosen from among a discrete set of doses including several non-zero predetermined doses recorded in the memory,
    wherein the set of elementary geometric shapes is a bidimensional paving of identical elementary geometric shapes covering the pattern for printing, and
    wherein, when the doses for application for said each elementary geometric shape of the set in the model are determined, performing a discretisation error correction by dithering.

2. The method for preparing a pattern for printing as claimed in claim 1, further comprising grouping together adjacent elementary geometric shapes of said each elementary geometric shape of the set in the model that have identical doses in geometric shapes of greater sizes, each for printing in a single exposure to the variable shaped electron beam.

3. The method for preparing a pattern for printing as claimed in claim 1, further comprising, before the modelling of the pattern, a prior modelling of the pattern by breaking down the pattern into a theoretical set of geometric shapes with different dimensions associated respectively with a set of theoretical doses, and when theoretical doses for application to the bidimensional paving of the set of elementary geometric shapes are determined, executing a prior pixelisation of the theoretical set on the set of elementary geometric shapes to determine initial values of the doses for application for the set of elementary geometric shapes of the set in the model.

4. The method for preparing a pattern for printing as claimed in claim 3, wherein a discrete set of doses is used during the prior modelling to determine the theoretical doses and is stored in the memory, the discrete set of doses being different than that used during the determination of the doses for application for said each elementary geometric shape of the set in the model, the discrete set comprising fewer discrete dose values.

5. The method for preparing a pattern for printing as claimed in claim 4, wherein the determining of the doses for application for said each elementary geometric shape of the set in the model comprises comparing the initial values of the doses with the discrete set of predetermined doses recorded in the memory, a selection of doses from the discrete set, and said discretisation error correction by dithering of errors caused by the selection.

6. The method for preparing a pattern for printing as claimed in claim 1, wherein the discrete set of predetermined doses are defined in the form of an electrical charge density expressed as a number of charges per unit surface.

7. The method for preparing a pattern for printing as claimed in claim 1, wherein the discretisation error correction by dithering is made from a predetermined error diffusion matrix of a Floyd-Steinberg algorithm.

8. The method for preparing a pattern for printing as claimed in claim 1, further comprising, when the doses for application for said each elementary geometric shape of the set in the model are determined:
   using a first discrete set of predetermined doses recorded in the memory, that is a coarse set, for the elementary geometric shapes in the pattern for printing; and
   using a second discrete set of predetermined doses recorded in the memory, that is a fine set, and comprising more discrete values of doses than the coarse set, for the elementary geometric shapes situated on a contour of the pattern for printing.

9. A non-transitory computer-readable storage medium including at least one computer program stored thereon, which, when executed by a processor associated with the non-transitory computer-readable storage medium, causes said processor to execute a method for preparing a pattern for printing on a plate or mask by electron beam lithography, comprising:
   modelling of the pattern by breaking down the pattern into a set of elementary geometric shapes for individual printing to reproduce said pattern, and recording the modelled pattern as a model in a memory; and
   determining, for each elementary geometric shape of the set in the model, by said processor accessing the memory, a dose of electrical charges for application to a variable shaped electron beam during the individual printing of said each elementary geometric shape, doses for said each elementary geometric shape of the set in the model being chosen from among a discrete set of doses including several non-zero predetermined doses recorded in the memory,
   wherein the set of elementary geometric shapes is a bidimensional paving of identical elementary geometric shapes covering the pattern for printing, and
   wherein, when the doses for application for said each elementary geometric shape of the set in the model are determined, performing a discretisation error correction by dithering.

10. A system for designing a printed circuit by printing patterns on a plate or mask using electron beam lithography, comprising:
    a memory configured to store parameters for modelling a pattern by a set of elementary geometric shapes for individual printing to reproduce said pattern; and
    a processor associated with said memory whereon computer program instructions are further stored, or that comprises integrated circuits, configured to prepare the pattern for printing by:
    modelling of the pattern by breaking down the pattern into the set of elementary geometric shapes for individual printing to reproduce said pattern, and recording the modelled pattern as a model in the memory; and
    determining, for each elementary geometric shape of the set in the model, by accessing the memory, a dose of electrical charges for application to a variable shaped electron beam during the individual printing of said each elementary geometric shape, doses for said each elementary geometric shape of the set in the model being chosen from among a discrete set of doses including several non-zero predetermined doses recorded in the memory,
    wherein the set of elementary geometric shapes is a bidimensional paving of identical elementary geometric shapes covering the pattern for printing, and
    wherein, when the doses for application for said each elementary geometric shape of the set in the model are determined, performing a discretisation error correction by dithering.

* * * * *